(12) United States Patent
Cohen

(10) Patent No.: US 10,422,845 B2
(45) Date of Patent: Sep. 24, 2019

(54) SYSTEMS AND METHODS FOR STEADY-STATE MAGNETIC RESONANCE FINGERPRINTING

(71) Applicant: The General Hospital, Boston, MA (US)

(72) Inventor: Ouri Cohen, Teaneck, NJ (US)

(73) Assignee: The General Hospital Corporation, Boston, MA (US)

(*) Notice: Subject to any disclaimer, the term of this patent is extended or adjusted under 35 U.S.C. 154(b) by 726 days.

(21) Appl. No.: 14/921,577

(22) Filed: Oct. 23, 2015

(65) Prior Publication Data

US 2016/0116559 A1   Apr. 28, 2016

Related U.S. Application Data

(60) Provisional application No. 62/068,317, filed on Oct. 24, 2014.

(51) Int. Cl.
*G01R 33/561* (2006.01)
*G01R 33/50* (2006.01)

(52) U.S. Cl.
CPC ....... *G01R 33/561* (2013.01); *G01R 33/5614* (2013.01); *G01R 33/50* (2013.01)

(58) Field of Classification Search
CPC ... G01R 33/561; G01R 33/5614; G01R 33/50
USPC ........................................ 324/309
See application file for complete search history.

(56) References Cited

U.S. PATENT DOCUMENTS

| 6,348,918 B1 | 2/2002 | Szeliski et al. |
| 6,700,374 B1 | 3/2004 | Wu et al. |
| 7,337,205 B2 | 2/2008 | Sazegari |
| 7,772,844 B2 | 8/2010 | Hurd |
| 7,848,797 B2 | 12/2010 | Kong et al. |
| 7,945,305 B2 | 5/2011 | Aggarwal et al. |
| 8,558,546 B2 | 10/2013 | Griswold et al. |
| 8,723,518 B2 | 5/2014 | Seiberlich et al. |

(Continued)

FOREIGN PATENT DOCUMENTS

| CN | 102891999 A | 1/2013 |
| CN | 103093430 A | 5/2013 |

(Continued)

OTHER PUBLICATIONS

Cohen, et al., Magnetic Resonance Fingerprinting Trajectory Optimization, In Proceedings of the 22nd Annual Meeting of ISMRM, Milan, Italy, 2014, No. 7153.

(Continued)

*Primary Examiner* — Reena Aurora
(74) *Attorney, Agent, or Firm* — Quarles & Brady LLP

(57) ABSTRACT

Systems and methods for accelerating magnetic resonance fingerprinting ("MRF") acquisitions are described. The method includes controlling the MRI system to acquire magnetic resonance fingerprinting (MRF) data from the subject by performing a gradient-echo pulse sequence. The pulse sequence includes maintaining residual transverse magnetization through a delay period performed between successive cycles of the pulse sequence. The delay period is selected to allow spins of different tissue types within the subject to evolve differently as a function of tissue parameters within the different tissue types during the delay period.

20 Claims, 5 Drawing Sheets

(56) References Cited

U.S. PATENT DOCUMENTS

| | | |
|---|---|---|
| 2009/0009167 A1* | 1/2009 | Du .................. G01R 33/4824 324/307 |
| 2012/0235678 A1 | 9/2012 | Seiberlich et al. |
| 2012/0296193 A1 | 11/2012 | Koktzoglou |
| 2013/0265047 A1 | 10/2013 | Griswold et al. |
| 2013/0265050 A1 | 10/2013 | Grodzki et al. |
| 2013/0278255 A1 | 10/2013 | Khalighi et al. |
| 2014/0055133 A1 | 2/2014 | I et al. |
| 2014/0103924 A1 | 4/2014 | Griswold |
| 2014/0167754 A1 | 6/2014 | Jerecic et al. |
| 2014/0266204 A1 | 9/2014 | Watanabe et al. |
| 2015/0070012 A1 | 3/2015 | Griswold et al. |
| 2015/0297101 A1* | 10/2015 | Hernandez-Garcia .................. G01R 33/56563 600/419 |
| 2016/0349341 A1 | 12/2016 | Cohen |
| 2016/0349342 A1 | 12/2016 | Cohen |

FOREIGN PATENT DOCUMENTS

| | | |
|---|---|---|
| WO | 2013010080 A1 | 1/2013 |
| WO | 2015160400 A2 | 10/2015 |

OTHER PUBLICATIONS

Labadie, et al., Rapid Metabolite Mapping with "Exorcycled SCEPSIS", Max Plank Institute Research Report 2010/2011, p. 255.

Ma, et al., Magnetic Resonance Fingerprinting, Nature, 2013, 495:187-192.

Scheffler, et al., Principles and Applications of Balanced SSFP Techniques, European Radiology, 2003, 13 (11):2409-2418.

Wang, et al., MRF Denoising With Compressed Sensing and Adaptive Filtering, In 2014 IEEE 11th International Symposium on Biomedical Imaging (ISBI), pp. 870-873.

* cited by examiner

SYSTEMS AND METHODS FOR STEADY-STATE MAGNETIC RESONANCE FINGERPRINTING

CROSS-REFERENCE TO RELATED APPLICATIONS

The present application is based on, claims priority to, and incorporates herein by reference for all purposes, U.S. Provisional Application Ser. No. 62/068,317, filed Oct. 24, 2014, and entitled "Steady-State Fast MR Fingerprinting."

STATEMENT REGARDING FEDERALLY SPONSORED RESEARCH

N/A

BACKGROUND

The present disclosure relates to systems and methods for magnetic resonance imaging ("MRI"). More particularly, systems and methods are described for steady-state data acquisitions used in magnetic resonance fingerprinting applications.

Magnetic resonance fingerprinting ("MRF") is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle ("FA"), radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

In order to reduce the scan time required for MRF, current methods either vastly undersample k-space by sampling along a single spiral at each acquisition or alternatively sample the entire k-space using an echo-planar imaging ("EPI") based sampling. While each method has its advantages, they are not without drawbacks as well. For example, undersampling a spiral sampling trajectory yields significant artifacts, which then require a large number of acquisitions to obtain an accurate match. On the other hand, EPI-based methods suffer from field inhomogeneity artifacts inherent to EPI and are therefore not suitable for high fields.

Given the above, there remains a need for improved an MRF acquisition techniques.

SUMMARY

The present disclosure overcomes the aforementioned drawbacks by providing systems and methods for generating a map of quantitative parameters of a subject. One method includes controlling the MRI system to (i) acquire magnetic resonance fingerprinting (MRF) data by fully sampling k-space, line-by-line, using a first flip angle and repetition time (TR), (ii) perform a delay to allow magnetization recover after reaching a steady state, and (iii) acquire MRF data after the delay by fully sampling k-space, line-by-line, using a second flip angle and TR. The MRI system is also controlled to repeat (i) through (iii) to acquire the MRF data from a desired portion of the subject. The method also includes estimating quantitative parameters of the subject using the MRF data by comparing the MRF data to a dictionary database and generating a map of quantitative parameters of the subject using the estimated quantitative parameters of the subject and the MRF data.

In accordance with one aspect of the present disclosure, a method is provided for generating a map of quantitative parameters of a subject using a magnetic resonance imaging (MRI) system. The method includes controlling the MRI system to acquire magnetic resonance fingerprinting (MRF) data from the subject by performing a gradient-echo pulse sequence that includes maintaining residual transverse magnetization through a delay period performed between successive cycles of the pulse sequence. The delay period is selected to allow spins of different tissue types within the subject to evolve differently as a function of tissue parameters within the different tissue types during the delay period. The method further includes estimating quantitative parameters of the subject using the MRF data by comparing the MRF data to a dictionary database and generating a map of quantitative parameters of the subject using the estimated quantitative parameters of the subject and the MRF data.

In accordance with another aspect of the present disclosure, a magnetic resonance imaging (MRI) system is disclosed. The MRI system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals from the subject using a coil array and a computer system. The computer system is programmed to control the MRI system to acquire magnetic resonance fingerprinting (MRF) data from the subject by performing a gradient-echo pulse sequence that includes maintaining residual transverse magnetization through a delay period performed between successive cycles of the pulse sequence. The delay period is selected to allow spins of different tissue types within the subject to evolve differently as a function of tissue parameters within the different tissue types during the delay period. The computer system is further programmed to estimate quantitative parameters of the subject using the MRF data by comparing the MRF data to a dictionary database and generate a map of quantitative parameters of the subject using the estimated quantitative parameters of the subject and the MRF data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1A:
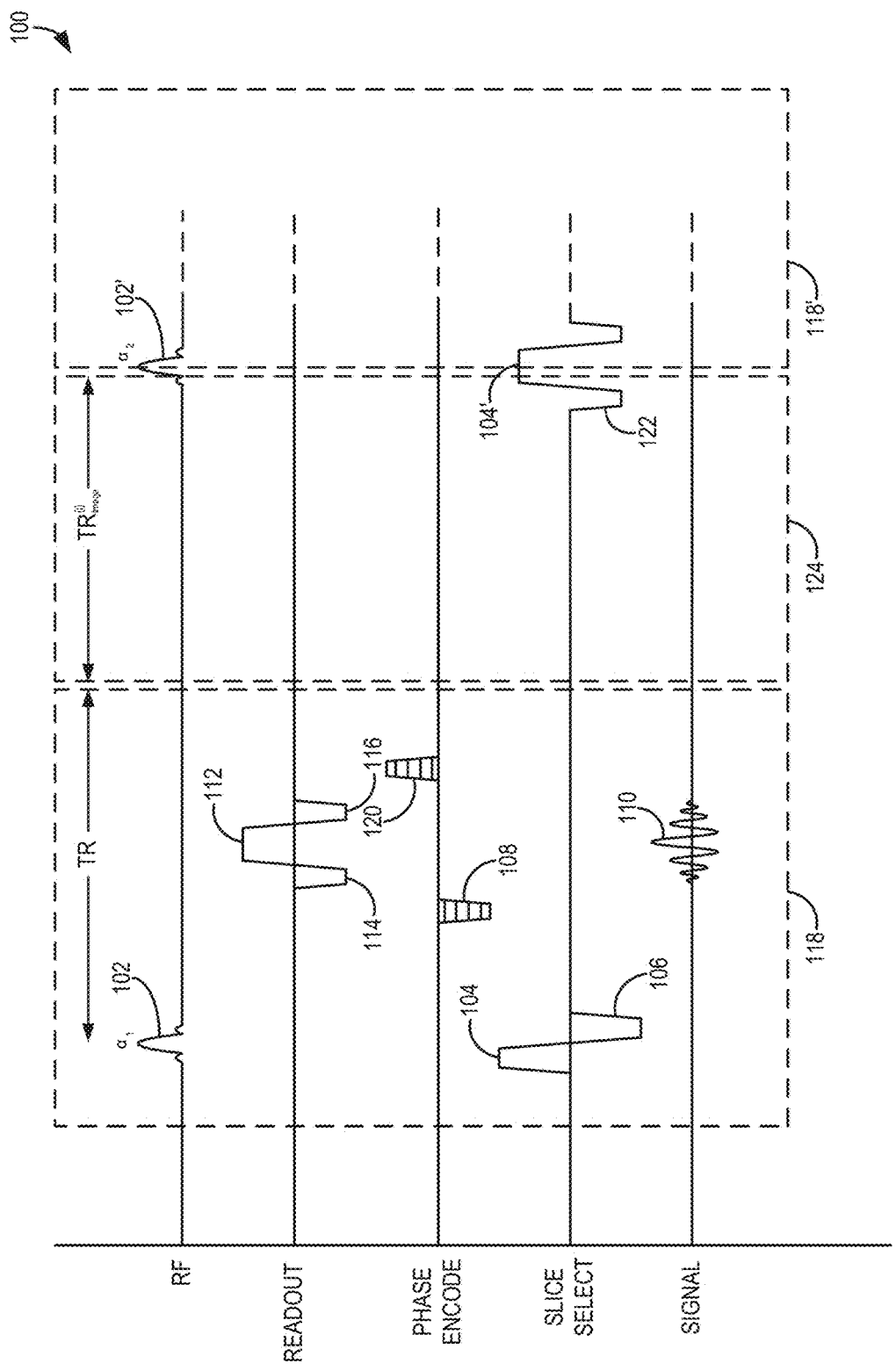
FIG. 1A is a pulse-sequence diagram for an magnetic resonance fingerprinting process in accordance with the present disclosure.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

To uniquely distinguish between various different tissue parameters, current implementations of MRF generally require a large number of acquisitions (e.g., greater than 1000) for each phase encoding line. A key difficulty in fully sampling k-space (fully sampling k-space refers to acquiring a number of samples indicated by the Nyquist criterion) is that the magnetization for each k-space line must have the same initial starting point in order to obtain images that are artifact free at each acquisition. However, since each phase encoding line is acquired with a set of TR/FA defined by the fingerprinting schedule, the object's spin magnetization after the acquisition of the first phase encoding line will depend on the evolution of the magnetization up until that point. Unless a suitable delay is applied to allow the magnetization to completely recover the resulting images will have significant artifacts. This delay (which is T1 dependent) may be several seconds long. With a large number of acquisitions for each phase encoding line, this delay severely increases the minimum scan time achievable.

To overcome this difficulty, the present disclosure provides systems and methods to use the steady-state achieved by balanced steady-state-free-precession (bSSFP) sequences to perform MRF acquisitions. Specifically, referring to FIG. 1A, a bSSFP pulse sequence 100 for use with MRF in accordance with the present disclosure is illustrated. The pulse sequence 100 begins with the application of an RF pulse 102 played out in the presence of a slice-selective gradient 104 to produce transverse magnetization in a prescribed slice. The flip angle for this slice-selective RF saturation pulse 260 is typically about 90 degrees; however, larger or smaller flip angles may be desirable in some circumstances. The slice-selective gradient 104 includes a rephasing lobe 106 that acts to mitigate unwanted phase accruals that occur during the application of the slice-selective gradient 104. After excitation of the spins in the slice, a phase encoding gradient pulse 108 is applied to position encode the MR signal 110 along one direction in the slice. A readout gradient pulse 112 is also applied after a dephasing gradient lobe 114 to position encode the MR signal 108 along a second, orthogonal direction in the slice. Like the slice-selective gradient 104, the readout gradient 112 also includes a rephasing lobe 116 that acts to mitigate unwanted phase accruals.

To maintain the steady state condition, the integrals along the three gradients each sum to zero during the repetition time ("TR") period 118. To accomplish this, a rewinder gradient lobe 120 that is equal in amplitude, but opposite in polarity of the phase encoding gradient 108, is played out along the phase encoding gradient axis. Likewise, a dephasing lobe 122 is added to the slice select gradient axis, such that the dephasing lobe 122 precedes the repetition of the slice-selective gradient in the next TR period.

The reading out of MR signals following the RF excitation pulse 102 is repeated and the amplitude of the phase encoding gradient 108 and its equal, but opposite rewinder 120 are stepped through a set of values to sample k-space in a prescribed manner. However, instead of acquiring each k-space line individually with the fingerprinting schedule, the entire k-space can be acquired, line by line, using a single FA ($\alpha_x$) and with a constant, short TR, as illustrated by 118'.

Since the FA and TR are constant and since all gradients are balanced, the magnetization quickly reaches a steady-state. Since the approach to steady-state may last over several k-space lines, the k-space can be oversampled and the initial lines, acquired before the magnetization has reached steady-state and, if needed, discarded. In this implementation, however, lines do not need to be discarded. The magnetization is then allowed to recover for a delay TR image 124 defined by the schedule. The magnetization is allowed to evolve over a delay time ($TR_{image}^{(j)}$), following which the process is repeated with the next FA in the schedule $\alpha_2$. That is, the magnetization from spins of different tissue types will evolve differently as a function of their tissue parameters during this delay period 124 of duration $TR_{image}^{(j)}$. Acceleration may be achieved by interleaving multiple slices during the delay period 124 for the acquisition of three-dimensional (3D) data. The spins are then excited by the next RF excitation pulse 102' in the schedule over the next TR 118' and the entire k-space is acquired once again.

As will be described, the pulse sequence 100 can be further combined with a schedule optimization method, which reduces the minimal necessary schedule length. As described, full k-space data may be acquired during each TR. As described above, the TR and FA can be consistent and the delay period 124 allows the magnetization from spins of different tissue types will evolve differently as a function of their tissue parameters. With this in mind, suitable acquisition parameters can then varied from one excitation to the next in accordance with a strategy that improves or optimizes the acquisition parameters to thereby improve the discrimination between quantitative parameters, while reducing the total number of acquisitions.

In contrast to previous methodologies, the approach presented herein controls time delays associated with requirements that subsequent phase-encoding k-space lines begin from thermal equilibrium. In addition, a significant reduction in undersampling and motion artifacts can be achieved by fully sampling k-space in timescales on the order of milliseconds. Moreover, by utilizing a Cartesian sampling trajectory, reconstruction and post-processing can be simplified compared to existing MRF applications, including by avoiding artifacts associated with regridding-based reconstructions.

Figure 1B:
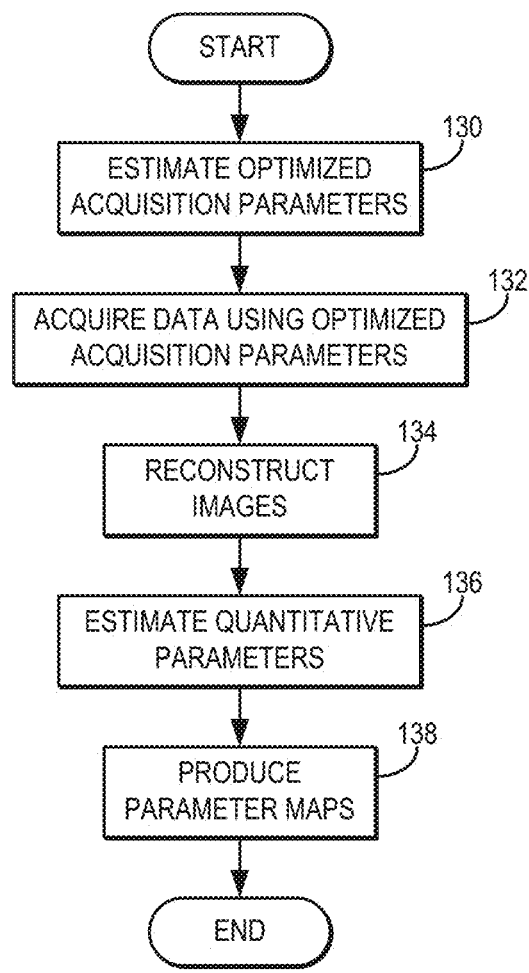
FIG. 1B is a flow chart setting forth one example of steps for a method in accordance with the present disclosure.

Referring now to FIG. 1B, a flowchart is illustrated as setting forth the steps of one non-limiting example method for estimating quantitative parameters from data acquired using acquisition parameters that have been selected to reduce the number of acquisitions necessary to desirably sample the quantitative parameter space. The method begins by generating a vector, or schedule, of acquisition parameters that has been selected (or, as a non-limiting example, optimized) to reduce the number of acquisitions necessary to sufficiently sample the quantitative parameter space, as indicated at step 130.

By way of example, the selection or optimization of acquisition parameters, such as FA and TR (e.g., varying $TR_{image}^{(j)}$), may include providing an initial, randomly-generated seed vector of the acquisition parameters to be selected or optimized. This seed vector may have a length, N, and be used to simulate the signal for a range, P, of quantitative parameters. For simplicity, this non-limiting example describes a $T_1$ mapping application, in which only a range, P, of $T_1$ values is simulated; however, it will be appreciated that other tissue parameters (e.g., $T_2$, proton density, off-resonance) can similarly be simulated. The seed vector and simulated quantitative parameters are used to form an N×P matrix, A. This matrix, A, can then be used to calculate a dot product matrix, $$D = A^T A \qquad (1).$$

The diagonal elements of this dot product matrix, D, indicate the closeness of a match between a magnetization trajectory resulting from a given quantitative parameter (e.g., $T_1$) and itself. The diagonal elements are, therefore, equal to one. The off-diagonal elements of the dot product matrix, D, however, indicate the quality of matching between every two different elements of the matrix, A. Discriminating between $T_1$ values in the matching process requires that the dot product of a measured magnetization trajectory with the pre-computed trajectory that is stored in the dictionary be high for the correct $T_1$ value and, ideally, zero for all others. To find the vector of acquisition parameters (e.g., TRs and FAs) that yield this optimum or a value that is sufficiently desirable, a model can be utilized. One non-limiting model is the following optimization problem:

$$\min_x f(x) \text{ such that } \sum_{i \neq j} D_{ij}(x) - \lambda \sum_{i=j} D_{ij}(x); \qquad (2a)$$

where $f(x)$ is the function to simulate the trajectories and compute the dot product matrix, D, given a vector, x, of acquisition parameters. A penalty term, $\lambda$, is applied as well to avoid minimizing the on-diagonal elements. Another non-limiting example is:

$$\min_x f(x) = \left( \sum_{i \neq j} D(x)_{ij} \Big/ \sum_{i=j} D(x)_{ij} \right); \qquad (2b)$$

where the ratio of off-diagonal to diagonal elements is minimized. As one example, a constrained non-linear solver can be used to solve Eqns. (2a) and (2b).

Referring again to FIG. 1, the method for estimating quantitative parameters continues by acquiring data by directing an MRI system to perform pulse sequences such as described with respect to FIG. 1A using the optimized acquisition parameters, as indicated at step 132.

At process block 134, images can be reconstructed from the acquired data. Quantitative parameters are then estimated by, for example, matching the reconstructed images to one or more pre-computed dictionaries, as indicated at step 136. In accordance with the present disclosure, the steady state can be accounted for in the dictionary generation process, such that the data acquired using the bSSFP pulse sequence 100 of FIG. 1A can be correctly reconstructed. To select the parameters, conventional matching algorithms can be used; however, in some configurations, an adaptive matching algorithm, such as the one described in co-pending PCT Application No. PCT/US15/11948, which is incorporated herein by reference in its entirety, can also be used. Parameter maps can then be generated using the estimated quantitative parameters, as indicated at step 138.

Figure 2A:
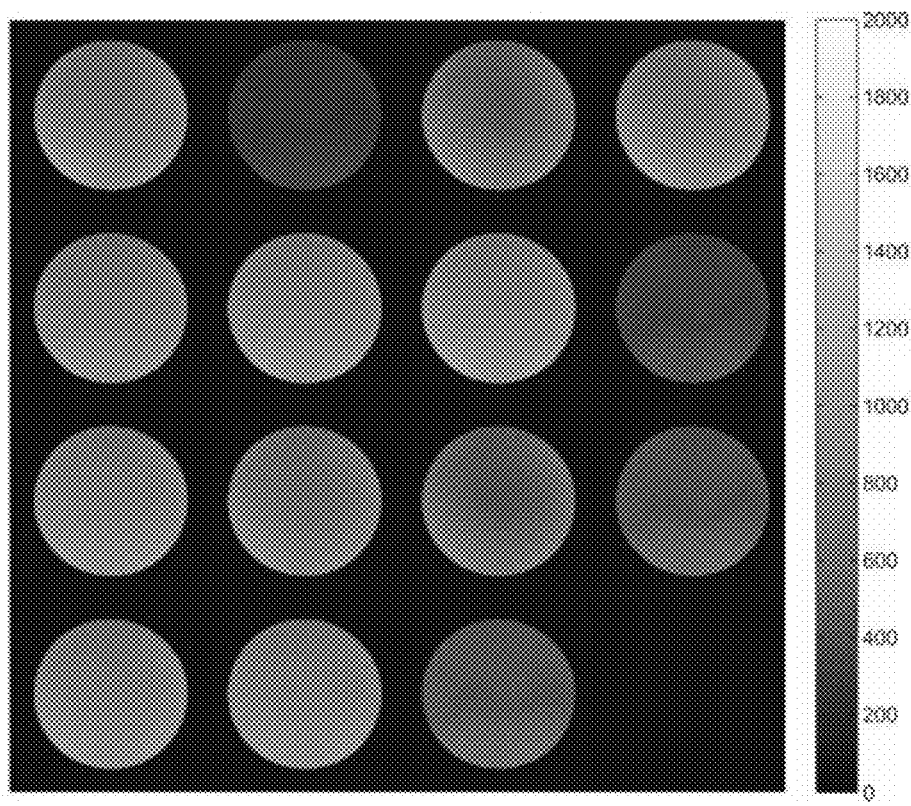
FIG. 2A is a set of images of a phantom acquired using the pulse sequence of FIG. 1A and example method of FIG. 1B.

By way of example, the pulse sequence 100 of FIG. 1A was tested on a cylindrical water phantom on a clinical 1.5 T scanner (Siemens Avanto) using a 4-channel head coil. The TR for each phase encoding line was set to 7 ms, the minimum achievable on the system. An optimized schedule of length N=15 was generated according to the algorithm described in above, where the delays $TR_{image}^{(j)}$ were set to range from 0-20 ms. The field-of-view was 300×300 mm with a matrix of 144×144 and a slice thickness of 5 mm. Total acquisition time for the 15 images shown in FIG. 2A was ~14 seconds. Note the variation in intensity that is indicative of the evolution of the magnetization.

Figure 2B:
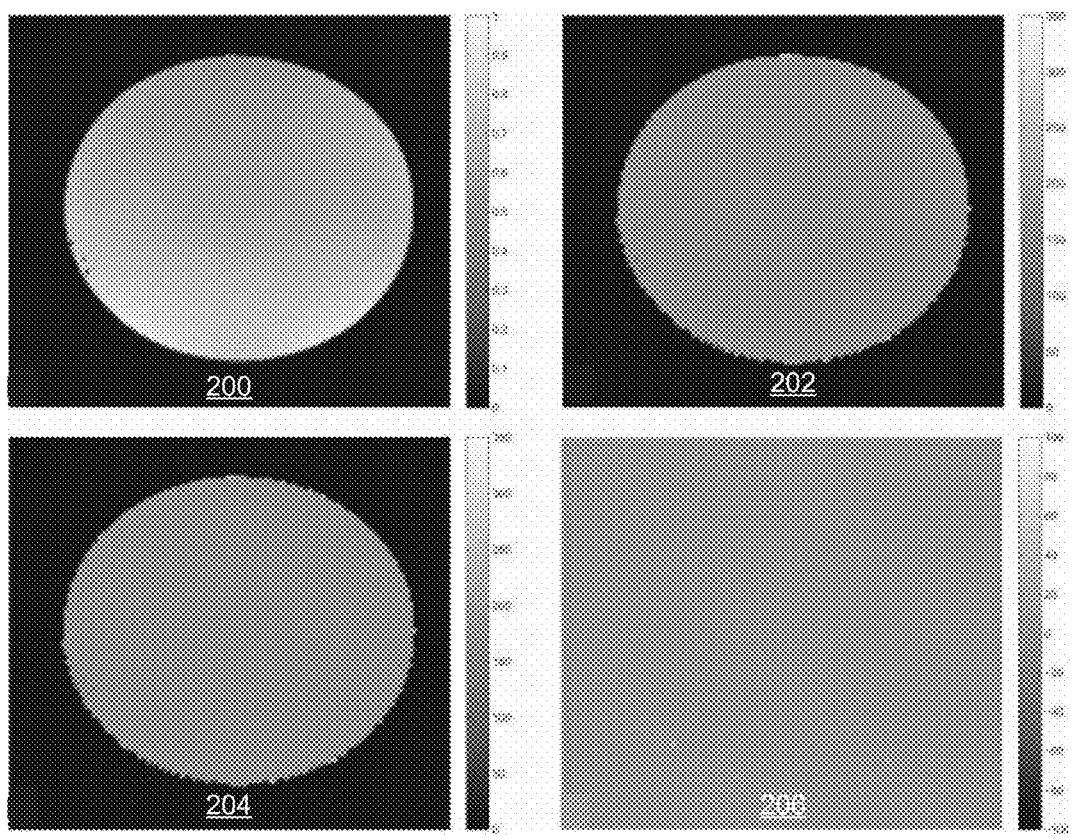
FIG. 2B is another set of images of a phantom acquired using the pulse sequence of FIG. 1A and example method of FIG. 1B.

The data was reconstructed using a dictionary that was generated by allowing the magnetization for a given set of tissue parameters to reach steady state. The reconstructed set of tissue parameter maps are shown in FIG. 2B. Specifically, FIG. 2B shows images that were acquired using the above-described system and methods and are proton-density weighted 200, $T_1$-weighted 202, $T_2$-weighted 204, and $B_0$-weighted 206.

In contrast to current techniques that acquire a single image per excitation, the above-described systems and methods allow for the acquisition of a single k-space line per excitation. This property controls against the need to under-sample k-space while simultaneously avoiding artifacts related to $B_0$ field inhomogeneities. Thus, this method may be used at both high (3 T) and ultrahigh fields (7 T, 15 T). Other benefits include a full Cartesian sampling of k-space, yielding high quality images and allowing easy reconstruction (simple FFT) of the data, contrary to the spiral sampling used in other methods. Despite the full sampling, the total scan time is kept controlled using the sequence and schedule optimization techniques, such as described herein.

Figure 3:
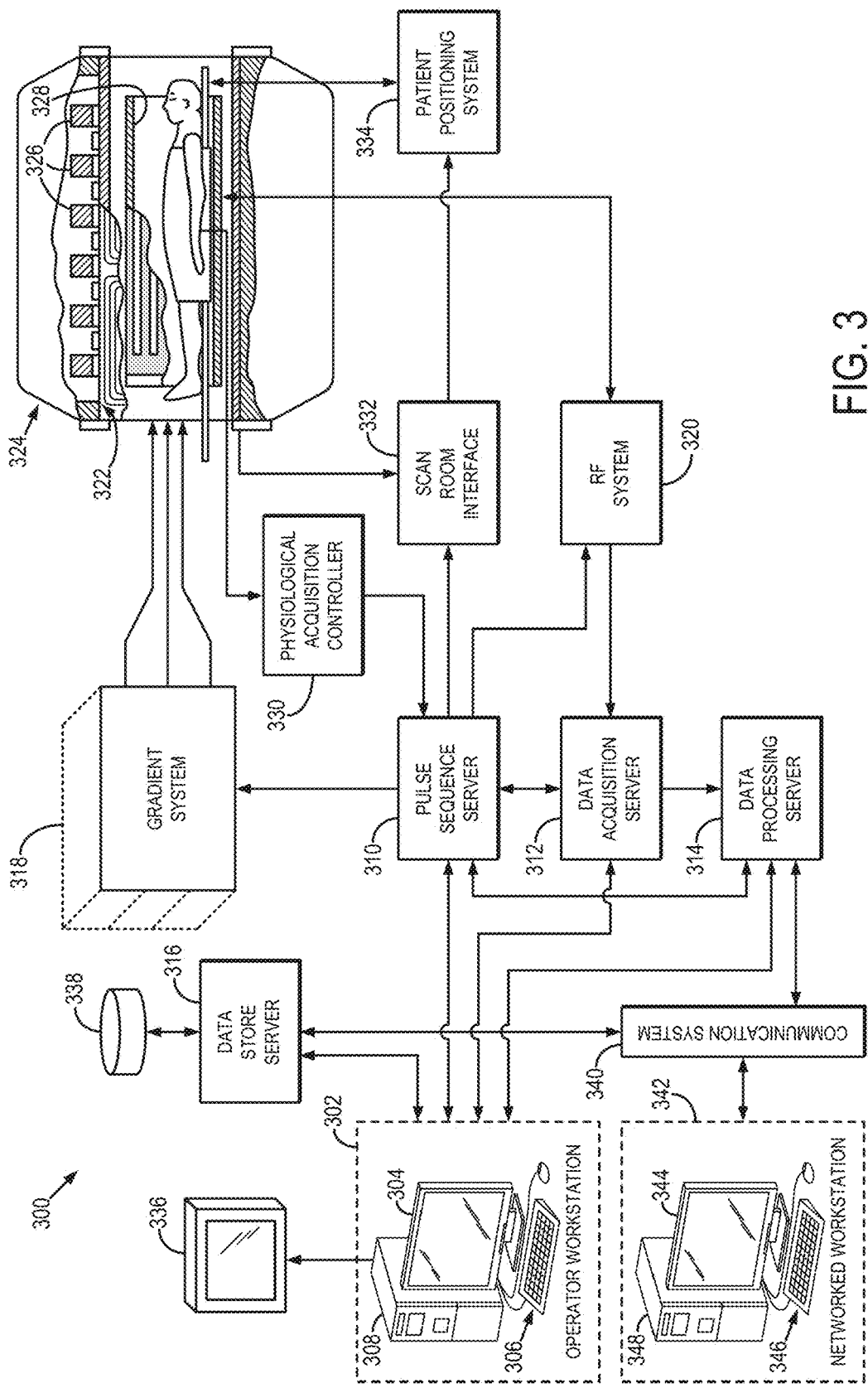
FIG. 3 is a block diagram of an example of a magnetic resonance imaging ("MRI") system for use in accordance with the present disclosure to perform the pulse sequence of FIG. 1 and/or example method of FIG. 1B.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (2);$$

and the phase of the received magnetic resonance signal may also be determined according to the following relationship:

$$\varphi = \tan^{-1}\left(\frac{Q}{I}\right). \qquad (3)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for generating a map of quantitative parameters of a subject using a magnetic resonance imaging (MRI) system, the method including steps comprising:
   (i) controlling the MRI system to:
      (1) acquire magnetic resonance fingerprinting (MRF) data by fully sampling k-space, line-by-line, using a first flip angle and repetition time (TR);
      (2) perform a delay by waiting a time selected to allow magnetization to recover after reaching a steady state;
      (3) acquire MRF data after the delay by fully sampling k-space, line-by-line, using a second flip angle and TR;
      (4) repeat (1) through (3) to acquire the MRF data from a desired portion of the subject;
   (ii) estimating quantitative parameters of the subject using the MRF data by comparing the MRF data to a dictionary database; and
   (iii) generating a map of quantitative parameters of the subject using the estimated quantitative parameters of the subject and the MRF data.

2. The method of claim 1 wherein the first flip angle and the second flip angle are different flip angles.

3. The method of claim 1 wherein the dictionary database accounts for steady-state MRF data acquisition.

4. The method of claim 1 includes step (i) includes performing a schedule optimization method prior to acquiring the MRF data to select minimal schedule lengths needed to fully sample k-space.

5. The method of claim 4 wherein the schedule optimization method includes reducing a total number of acquisitions by selecting acquisition parameters that are varied between excitations to improve discrimination between the quantitative parameters.

6. The method of claim 1 wherein step (i)(2) includes interleaving multiple slices during the delay to acquire three-dimensional (3D) imaging data.

7. A method for generating a map of quantitative parameters of a subject using a magnetic resonance imaging (MRI) system, the method including steps comprising:
   (i) controlling the MRI system to acquire magnetic resonance fingerprinting (MRF) data from the subject by performing a gradient-echo pulse sequence that includes maintaining residual transverse magnetization through a delay period performed between successive cycles of the pulse sequence, wherein the delay period is selected to allow spins of different tissue types within the subject to evolve differently as a function of tissue parameters within the different tissue types during the delay period;
   (ii) estimating quantitative parameters of the subject using the MRF data by comparing the MRF data to a dictionary database; and
   (iii) generating a map of quantitative parameters of the subject using the estimated quantitative parameters of the subject and the MRF data.

8. The method of claim 7 wherein the dictionary database accounts for steady-state MRF data acquisition.

9. The method of claim 7 wherein step (i) includes performing a schedule optimization method prior to acquiring the MRF data to select minimal schedule lengths needed to fully sample k-space with each repetition time of the pulse sequence.

10. The method of claim 9 wherein the schedule optimization method includes reducing a total number of acquisitions by selecting acquisition parameters that are varied between excitations to improve discrimination between the quantitative parameters.

11. The method of claim 7 wherein step (i) further includes:
   (a) estimating acquisition parameters that are selected to direct the MRI system to generate a plurality of different signal evolutions that maximize discrimination between different quantitative parameters in a selected number of repetition time (TR) periods; and
   (b) acquiring the MRF data with the MRI system by directing the MRI system to perform a plurality of successive cycles of the pulse sequence using the optimized acquisition parameters, the MRF data representing the plurality of different signal evolutions that maximize discrimination between different quantitative parameters.

12. The method of claim 11 wherein step (a) includes estimating the acquisition parameters by minimizing an objective function that simulates the acquisition parameters and computed a matrix that is based on estimated values of the acquisition parameters and the quantitative parameters to be estimated.

13. The method of claim 12 wherein step (a) includes selecting initial estimates of the acquisition parameters and forming the matrix based on the initial estimates.

14. The method of claim 12 wherein the matrix comprises a first matrix that defines a dot product between a second matrix and a transpose of the second matrix, wherein the second matrix includes estimates of the acquisition parameters and simulated values for the quantitative parameters.

15. The method of claim 12 wherein the objective function is minimized by searching for the acquisition parameters that minimize a difference between a sum of off-diagonal elements of the matrix and a sum of on-diagonal elements of the matrix.

16. The method of claim 7 wherein step (i) includes interleaving multiple slices during the delay period to acquire three-dimensional (3D) imaging data.

17. A magnetic resonance imaging (MRI) system, comprising:
a magnet system configured to generate a polarizing magnetic field about at least a portion of a subject arranged in the MRI system;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
control the MRI system to acquire magnetic resonance fingerprinting (MRF) data from the subject by performing a gradient-echo pulse sequence that includes maintaining residual transverse magnetization through a delay period performed between successive cycles of the pulse sequence, wherein the delay period is selected to allow spins of different tissue types within the subject to evolve differently as a function of tissue parameters within the different tissue types during the delay period;
estimate quantitative parameters of the subject using the MRF data by comparing the MRF data to a dictionary database; and
generate a map of quantitative parameters of the subject using the estimated quantitative parameters of the subject and the MRF data.

18. The system of claim 17 wherein the dictionary database accounts for steady-state MRF data acquisition.

19. The system of claim 17 wherein the computer system is further programmed to perform a schedule optimization method prior to acquiring the MRF data to select minimal schedule lengths needed to fully sample k-space with each repetition time of the pulse sequence.

20. The system of claim 19 wherein the schedule optimization method includes reducing a total number of acquisitions by selecting acquisition parameters that are varied between excitations to improve discrimination between the quantitative parameters.

* * * * *